US011979160B2

(12) United States Patent
Kim et al.

(10) Patent No.: US 11,979,160 B2
(45) Date of Patent: May 7, 2024

(54) SINGLE-SIGNAL RECEIVER INCLUDING ACTIVE INDUCTOR CONTINUOUS TIME LINEAR EQUALIZER AND REFERENCE VOLTAGE SELECTION EQUALIZER, AND METHOD FOR OPERATING THE SAME

(71) Applicant: Korea University Research and Business Foundation, Seoul (KR)

(72) Inventors: Chulwoo Kim, Seoul (KR); Jong-Hyuck Choi, Suwon-si (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 17/961,122

(22) Filed: Oct. 6, 2022

(65) Prior Publication Data

US 2023/0128820 A1    Apr. 27, 2023

(30) Foreign Application Priority Data

Oct. 15, 2021 (KR) .................. 10-2021-0137892

(51) Int. Cl.
*H04B 3/04* (2006.01)
*H03K 5/1252* (2006.01)
*H03K 17/687* (2006.01)
*H04B 10/69* (2013.01)
*H04L 27/01* (2006.01)

(52) U.S. Cl.
CPC ....... *H03K 5/1252* (2013.01); *H03K 17/6872* (2013.01); *H04B 10/6971* (2013.01); *H04L 27/01* (2013.01)

(58) Field of Classification Search
CPC ............ H03F 3/45197; H03F 3/45179; H03F 2200/451; H03F 3/193; H03F 3/45183; H03F 2203/45488; H03F 3/45188; H04L 25/03057; H04L 25/03885; H04L 25/03878; H04L 25/0272; H04L 7/033; H04L 7/0087; H04L 27/01; H04L 25/03146; H04B 3/04; H04B 1/16; H04B 1/1607; H04B 1/40; H04B 3/14;
(Continued)

(56) References Cited

U.S. PATENT DOCUMENTS 9,577,815 B1 * 2/2017 Simpson ................. H04L 25/49
10,785,070 B1 * 9/2020 Takada .................. H04L 7/0337
(Continued)

FOREIGN PATENT DOCUMENTS

KR        10-0754967 B1    9/2007
KR   10-2010-0027191 A    3/2010
(Continued)

*Primary Examiner* — Eva Y Puente
(74) *Attorney, Agent, or Firm* — NSIP Law

(57) ABSTRACT

A single-signal receiver including an active inductor continuous time linear equalizer and a reference voltage selection equalizer is provided. The single-signal receiver includes a continuous time linear equalizing unit to receive a single signal, and compensate for distortion of the single signal to generate an output, and a reference voltage selection equalizing unit to select one of a first reference voltage value and a second reference voltage value based on a previous output from a comparator, and sample the output from the continuous time linear equalizing unit, based on the one of the first reference voltage value and the second reference voltage value.

19 Claims, 11 Drawing Sheets

(58) Field of Classification Search
CPC .......... H04B 1/12; H04B 1/123; H04B 10/69; H04B 10/693
USPC ........................................................ 375/229
See application file for complete search history.

(56) References Cited

U.S. PATENT DOCUMENTS

| | | |
|---|---|---|
| 2006/0245485 A1 | 11/2006 | Martin et al. |
| 2012/0201289 A1* | 8/2012 | Abdalla .............. H04L 25/0272 375/232 |
| 2019/0379340 A1* | 12/2019 | Rattan .................. H03G 3/3026 |
| 2021/0305941 A1* | 9/2021 | Takeuchi .............. H04B 1/1607 |
| 2022/0051742 A1* | 2/2022 | M. ........................ G11C 29/021 |
| 2022/0123973 A1* | 4/2022 | Kim .................. H04L 25/03114 |

FOREIGN PATENT DOCUMENTS

| | | |
|---|---|---|
| KR | 10-0965767 B1 | 6/2010 |
| KR | 10-2016-0089922 A | 7/2016 |
| KR | 10-1949826 B1 | 2/2019 |
| KR | 10-2020-0013245 A | 2/2020 |

* cited by examiner

SINGLE-SIGNAL RECEIVER INCLUDING ACTIVE INDUCTOR CONTINUOUS TIME LINEAR EQUALIZER AND REFERENCE VOLTAGE SELECTION EQUALIZER, AND METHOD FOR OPERATING THE SAME

CROSS-REFERENCE TO RELATED APPLICATIONS

This application claims priority under 35 U.S.C. § 119 to Korean Patent Application No. 10-2021-0137892 filed on Oct. 15, 2021, in the Korean Intellectual Property Office, the disclosures of which are incorporated by reference herein in their entireties.

BACKGROUND

Embodiments of the present disclosure described herein relate to a single-signal receiver, and more particularly, relate to a single-signal receiver including an active inductor continuous time linear equalizer and a reference voltage selection equalizer.

A conventional continuous time linear equalizer circuit removes a channel inter-symbol interference (ISI) by receiving a differential signal and amplifying a component of a specific frequency. In this case, when the differential signal is input, the output is linearly amplified without being distorted. To apply the above description to a single-signal manner, an amplifier, which changes the single signal to a differential signal, is needed to be installed before the continuous time linear equalizer. The amplifier to change the single signal to the different signal receives a single input signal, compares the single input signal with a constant voltage value, and outputs the differential signal.

However, two inputs to the amplifier are not differential signals, so outputs are not completely symmetrical differential signals to each other, thereby causing signal distortion.

In addition, a conventional differential decision feedback equalizer adds a current, which is having the polarity opposite to that of the ISI, to an ISI, which is generated through a channel in the form of a circuit, thereby removing the ISI. However, the above structure is based on a differential structure. Accordingly, the input signal is a differential signal. In addition, since a constant current source is used, a current is constantly consumed.

In addition, the differential decision feedback equalizer is connected after the continuous time linear equalizer. Accordingly, the output from the differential decision feedback equalizer may be non-linear, based on the output from an asymmetrical continuous time linear equalizer circuit.

As described above, when a single-signal manner is applied to an equalizer based on a differential structure, the equalizer may not normally operate or the performance of the equalizer may be restricted.

SUMMARY

Embodiments of the present disclosure provide a single-signal receiver including an active inductor continuous time linear equalizer and a reference voltage selection equalizer which are useful to a single input signal without signal distortion.

According to an embodiment, a single-signal receiver includes a continuous time linear equalizing unit to receive a single signal, and to compensate for distortion of the single signal to generate an output, and a reference voltage selection equalizing unit to select one of a first reference voltage value and a second reference voltage value based on a previous output from a comparator, and samples the output from the continuous time linear equalizing unit, based on the one of the first reference voltage value and the second reference voltage value.

According to an embodiment, the continuous time linear equalizing unit may compensate for the single signal by amplifying a high-frequency gain.

According to an embodiment, the continuous time linear equalizing unit may include a first type active inductor equalizing unit having two poles and one zero and a second type active inductor equalizing unit having two poles and two zeros.

According to an embodiment, the continuous time linear equalizing unit may include the first type active inductor equalizing unit and the second type active inductor equalizing unit, the first type active inductor equalizing unit may include a first transistor connected between a power supply voltage and an output node, a second transistor and a third transistor connected to each other in series between the output node and a ground voltage, and a resistor connected between a gate of the first transistor and the output node.

According to an embodiment, the second transistor may form a current path between the output node and a first node, based on an input voltage, and the third transistor may form a current path between the first node and the ground voltage, based on a bias voltage.

According to an embodiment, the first transistor may be a P-channel metal-oxide-semiconductor (PMOS) transistor, and the second transistor and the third transistor may be N-channel metal-oxide-semiconductor (NMOS) transistors, and a first resistor and a second resistor may be variable resistors.

According to an embodiment, the first transistor may be an NMOS transistor, and the second transistor and the third transistor may be PMOS transistors.

According to an embodiment, the second type active inductor equalizing unit may include a first transistor connected between the power supply voltage and the output node, and a second transistor and a third transistor connected in series between the output node and the ground voltage, a first resistor connected between a gate of the first transistor and the output node, and a second resistor connected between a drain of the first transistor and the output node.

According to an embodiment, the first transistor may be a PMOS transistor, and the second transistor and the third transistor may be NMOS transistors, and a first resistor and a second resistor may be variable resistors.

According to an embodiment, the first transistor may be an NMOS transistor, and the second transistor and the third transistor may be PMOS transistors.

According to an embodiment, the variable resistor may be adjusted through a first scheme and a second scheme.

According to an embodiment, the first scheme is to connect the resistor to a transistor in parallel, and to adjust a resistance depending on a gate voltage value of the transistor.

According to an embodiment, the second scheme is to connect a transistors having a binary size or a thermometer size in parallel, and to adjust the resistance by inputting a signal of '0' or '1' to the gate of the transistor.

According to an embodiment, the reference voltage selection equalizing unit may include a multiplexer to receive the first reference voltage value and the second reference voltage value and receive a previous output from the comparator, and a comparator to compare one of the first reference voltage value and the second reference voltage value, which is selected through the multiplexer, and the output from the reference voltage selection equalizing unit.

According to an embodiment, the first reference voltage value may be a reference voltage value in a high state, and the second reference voltage value may be a reference voltage value in a low state.

According to an embodiment, when the previous output from the comparator is in a high state, the multiplexer selects the first reference voltage value and inputs the first reference voltage value to the comparator. When the previous output from the comparator is in a low state, the multiplexer may select the second reference voltage value and may input the second reference voltage value to the comparator.

According to an embodiment, a method for operating a single-signal receiver includes receiving a single signal, compensating for distortion of the single signal, and generating an output, and selecting one of a first reference voltage value and a second reference voltage value based on a previous output from a comparator, and sampling the output from a continuous time linear equalizing unit, based on the one of the first reference voltage value and the second reference voltage value.

According to an embodiment, the sampling of the output from the continuous time linear equalizing unit may include receiving the first reference voltage value and the second reference voltage value, receiving the previous output from the comparator, selecting one of the first reference voltage value and the second reference voltage value, and comparing the selected reference voltage value with the output from the reference voltage selection equalizing unit.

According to an embodiment, the method may include: selecting, by the multiplexer, the first reference voltage value to input the first reference voltage value to the comparator when the previous output from the comparator is in a high state, and selecting the second reference voltage value to input the second reference voltage value to the comparator, when the previous output from the comparator is in a low state.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
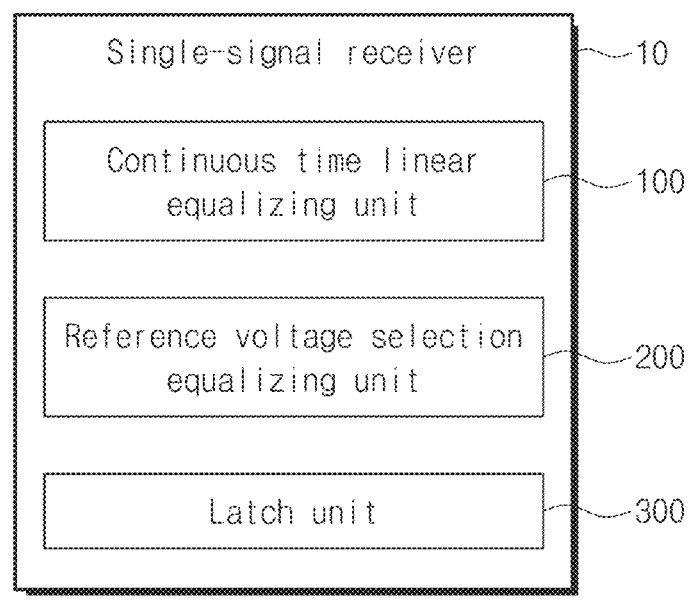
FIG. 1 is a block diagram of a single-signal receiver, according to an embodiment of the present disclosure.

Hereinafter, embodiments of the present disclosure will be described in detail with reference to the attached drawings to the extent that the embodiments of the present disclosure are easily reproduced by those skilled in the art. FIG. 1 is a block diagram of a single-signal receiver, according to an embodiment of the present disclosure.

Referring to FIG. 1, a single-signal receiver according to an embodiment of the present disclosure may include a continuous time linear equalizing unit 100, a reference voltage selection equalizing unit 200, and a latch unit 300.

The continuous time linear equalizing unit 100 may receive a single signal, may compensate for distortion of the single signal, and may output a single signal in which signal distortion has been compensated. The continuous time linear equalizing unit 100 may compensate for a signal by amplifying a high-frequency gain.

According to an embodiment, the continuous time linear equalizing unit 100 may include a first active inductor equalizing unit and a second active inductor equalizing unit. The first active inductor equalizing unit may be implemented by adding one resistor to a diode-connected transistor in this case, in the first active inductor equalizing unit, a direct current (DC) gain may be maintained without change, and the high-frequency gain may increase as the resistance value increases.

The second active inductor equalizing unit may be implemented by adding at least one resistor to the first active inductor equalizing unit. In this case, in the second active inductor equalizing unit, a DC gain may be increased, and a high-frequency peaking gain may be more increased. Accordingly, the continuous time linear equalizing unit 100 may compensate for channel attenuation while maintaining the magnitude of a signal.

The details thereof will be described below with reference to FIGS. 3A, 3B, 4A, and 4B.

The reference voltage selection equalizing unit 200 may select one of a first reference voltage value and a second reference voltage value, based on a previous output from the comparator, and may sample the output from the continuous time linear equalizing unit 100, based on one of the selected one of the first reference voltage value and the second reference voltage value. In this case, the reference voltage selection equalizing unit 200 may be a decision-feedback equalizer.

According to an embodiment, the reference voltage selection equalizing unit 200 may be implemented in one of a full rate structure, a half rate structure, and a half rate loop unrolling structure. Hereinafter, the reference voltage selection equalizing unit 200 implemented in the full rate structure will be described, for convenience of explanation. The reference voltage selection equalizing unit 200 may include a multiplexer (MUX) and a comparator.

The MUX may receive the first and second reference voltage values and may receive previous output data from the comparator. In other words, the MUX may receive the previous output data from the comparator and may select one of the first and second reference voltage values, based on the previous output data from the comparator. The reference voltage selected based on the previous output data may be input to the comparator to control a present output data from the comparator.

The comparator may perform sampling by comparing the output from the continuous time linear equalizing unit 100 with one, which is selected from the MUX, of the first and second reference voltage values. The comparator may perform a sampling operation for a present digital signal by comparing a present output from the continuous time linear equalizing unit 100 with one, which is selected based on the previous output data, of the first and second reference voltage values. In this case, present output data from the comparator may be fed back to the MUX, thereby widening an eye margin area. The details thereof will be described later with reference to FIGS. 5A to 5C.

The latch unit 300 may transform an output from the reference voltage selection equalizing unit 200 into a non-return-to-zero (NRZ) signal. The latch unit 300 may transform a return-to-zero (RZ) signal, which is an output of the comparator, into an NRZ signal by using an SR latch. In other words, the latch unit 300 may receive an RZ signal, transform the RZ signal into an NRZ signal, and output the transformed NRZ signal.

As described above, according to an embodiment of the present disclosure, the single-signal receiver 10 may receive a single signal to compensate for signal distortion, may select one reference voltage value of the first and second reference voltage values, based on previous data, and may output a signal having a wider eye margin area by comparing the selected reference voltage value and a single signal compensated in signal distortion.

More specifically, the single-signal receiver 10 may receive a single signal, may compensate for distortion of the single signal, and may output a single signal in which signal distortion has been compensated. The single-signal receiver 10 may select one of the first and second reference voltage values, based on the previous output from the comparator. The single-signal receiver 10 may compare the single signal compensated in distortion with one voltage value selected from the first and second reference voltage values.

Accordingly, the single-signal receiver 10 may provide an output signal without distortion of the signal, in spite of the single input signal. The single-signal receiver 10 may increase an eye margin which is a range for restoring data, by changing the reference voltage value based on the previous data.

Figure 2:
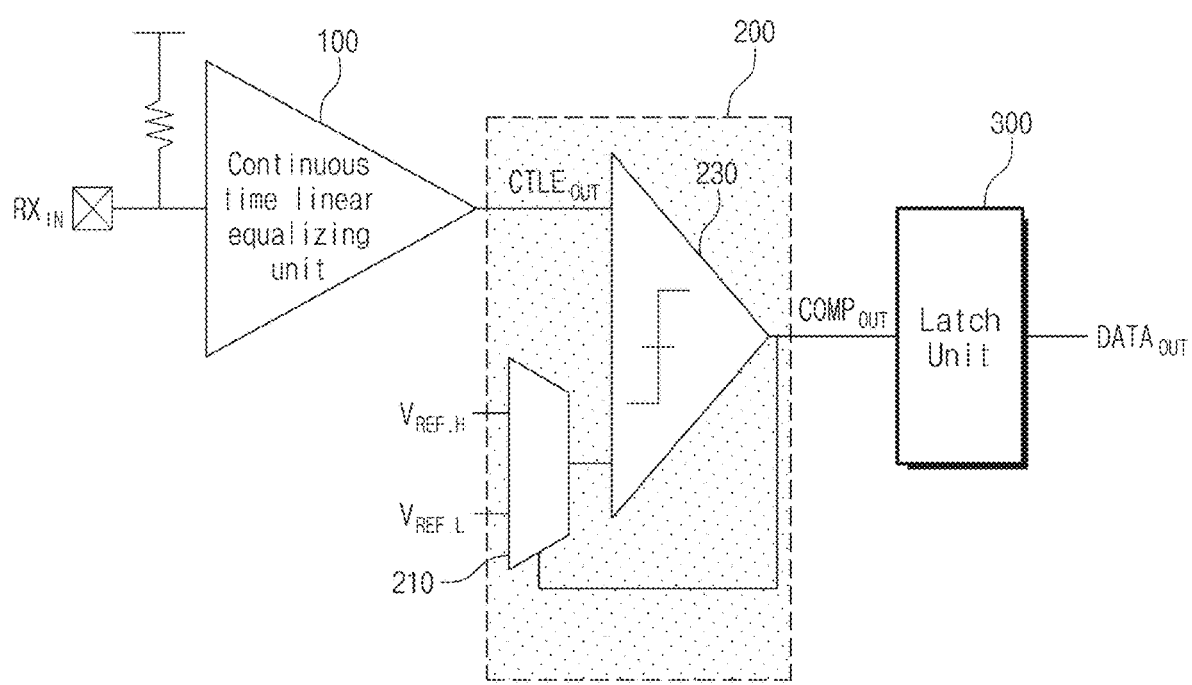
FIG. 2 is a view illustrating a single-signal receiver in detail, according to an embodiment of the present disclosure.

FIG. 2 is a view illustrating a single-signal receiver 10 in detail, according to an embodiment of the present disclosure.

Referring to FIG. 2, a single-signal receiver 10 according to an embodiment of the present disclosure may include a continuous time linear equalizing unit 100, a reference voltage selection equalizing unit 200, and a latch unit 300. Since the single-signal receiver 10 of FIG. 2 is the same as or similar to the single-signal receiver 10 of FIG. 1, the details thereof will be omitted.

The continuous time linear equalizing unit 100 may receive a single input signal $RX_{IN}$. In this case, the continuous time linear equalizing unit 100 may output an output signal $CTLE_{OUT}$ by compensating for distortion of the single input signal which is received. In this case, the output signal $CTLE_{OUT}$ may be input to a comparator 230 of the reference voltage selection equalizing unit 200.

The reference voltage selection equalizing unit 200 may include a MUX 210 and the comparator 230. The comparator 230 may receive the output signal $CTLE_{OUT}$ from the continuous time linear equalizing unit 100 and an output from the MUX 210, compare the output signal $CTLE_{OUT}$ with the output from the MUX 210, and perform a sampling operation for a digital signal $COMP_{OUT}$, such that the digital signal $COMP_{OUT}$ may be output. In this case, the digital signal $COMP_{OUT}$ may be fed back to the MUX 210.

The comparator 230 may output a previous digital signal $COMP_{OUT}$ for a previous signal and may feed-back the previous digital signal $COMP_{OUT}$ to the MUX 210. The MUX 210 may select one of a first reference voltage value $V_{REF}$ and a second reference voltage value $V_{REF\_L}$ based on the fed-back previous digital signal $COMP_{OUT}$. In this case, the output from the MUX 210 may be input to the comparator 230 for a next operation.

For example, when the previous digital signal $COMP_{OUT}$ is high, the MUX 210 may receive feedback on the previous digital signal $COMP_{OUT}$, which is high, and select the first reference voltage value $V_{REF,\,H}$. The comparator 230 may compare a present output signal $CTLE_{OUT}$ from the continuous time linear equalizing unit 100 with the first reference voltage value $V_{REF,\,H}$ which is selected based on the previous digital signal $COMP_{OUT}$, to output a present digital signal $COMP_{OUT}$.

In addition, the digital signal $COMP_{OUT}$ may be input to the latch unit 300. The latch unit 300 may receive an RZ-type digital signal $COMP_{OUT}$, and transform the RZ type into an NRZ type, such that the output signal $DATA_{OUT}$ is output.

Figure 3A:
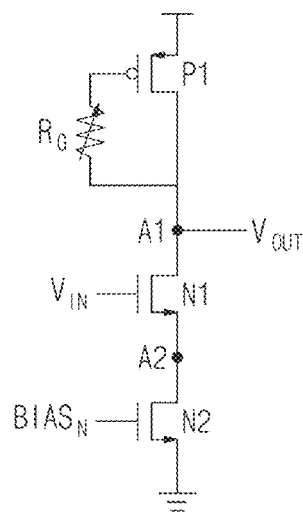
FIG. 3A illustrates a first type active inductor equalizing unit according to an embodiment of present disclosure.
Figure 3B:
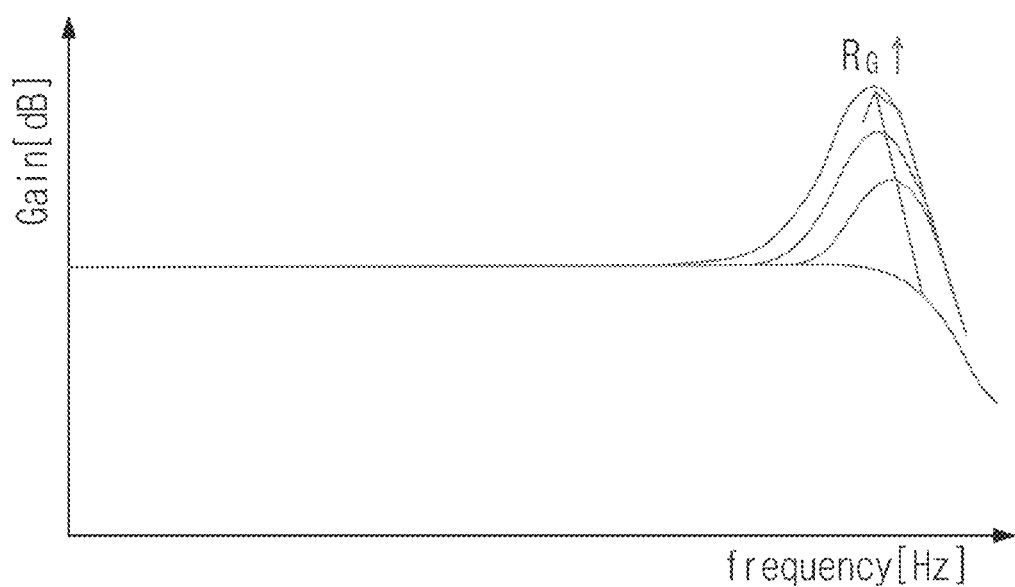
FIG. 3B illustrates an AC response of the first type active inductor equalizing unit.

FIG. 3A illustrates the first type active inductor equalizing unit according to an embodiment of present disclosure, and FIG. 3B illustrates an AC response of the first type active inductor equalizing unit.

Referring to FIG. 3A, the first type active inductor equalizing unit may include first to third transistors and a resistor.

A first transistor P1 may be connected between a power supply voltage and an output node A1, and second and third transistors N1 and N2 may be connected to each other in series between the output node A1 and a ground voltage. A resistor $R_G$ may be connected between a gate of the first transistor P1 and the output node A1. In this case, the resistor $R_G$ may be connected to the first transistor P1 in parallel to function as a variable resistor.

According to an embodiment, the first transistor P1 may be a PMOS transistor, the second and third transistors N1 and N2 may be NMOS transistors, and the resistor $R_G$ may be a variable resistor. In this case, the first type active inductor equalizing unit may have two poles and one zero.

Although FIG. 3A illustrates that an input is provided to an NMOS transistor, this is provided only for the illustrative purpose. For example, an input may be provided to a PMOS transistor. For example, the first transistor P1 may be a NMOS transistor, and the second and third transistors N1 and N2 may be PMOS transistors.

The third transistor may serve as a current source to receive a signal $BIAS_N$ and to allow a current to uniformly flow, thereby maintaining the transconductance of the second transistor. In this case, the first transistor and the resistor may be interpreted as a diode connected transistor. Accordingly, in the first type active inductor equalizing unit, the first transistor and the resistor may function as a load, and peaking is made at a high frequency, thereby serving as a continuous time linear equalizer circuit.

According to an embodiment, the resistance may be changed based on first and second schemes.

According to an embodiment, the first scheme, which is an analog scheme, is to connect the resistor to the transistor in parallel, and to adjust a resistance depending on a gate voltage value of the transistor. For example, in the PMOS transistor, as the voltage of the gate approximates '0', the resistance may be decreased. Accordingly, the total resistance may be decreased.

The second scheme, which is a digital scheme, is to connect a resistor to a plurality of transistors in parallel, and to input a signal of '0' or '1' to the gate voltage value to adjust the resistance. For example, when the number of transistors receiving a signal of '0' is increased, the resistance of the transistor is decreased, such that the total resistance may be decreased. In this case, the size of the transistor may be designed in a binary manner or thermometer manner. In the binary manner, the size of the transistor may be increased to the multiple thereof. For example, the size of the N-th transistor may be N times greater than the size of the first transistor. Meanwhile, in the thermometer manner, the transistors have an equal size.

The second transistor N1 may form a current path between the output node A1 and a first node A2, based on an input voltage $V_{IN}$, and the third transistor N2 may form a current path between the first node A2 and the ground voltage based on the bias voltage $BIAS_N$.

The third transistor N2 may form a current path based on the bias voltage $BIAS_N$, such that a current uniformly flows. Accordingly, the transconductance of the second transistor N1 may be maintained.

Referring to FIG. 3B, an alternating current (AC) response of the first type active inductor equalizing unit may be recognized. Since the first type active inductor equalizing unit has one zero, a DC gain is maintained without change, and the high-frequency gain increases, as the resistance increases. Accordingly, channel attenuation may be compensated while maintaining the magnitude of the signal.

The DC gain may be calculated through Equation 1.

$$DCgain = \frac{g_{m.N1} r_{o.P1}}{g_{m.P1} r_{o.P1} + 1} \quad \text{Equation 1}$$

In this case, $r_{o.P1}$ may denote a parasitic resistance of the first transistor, $g_{m.P1}$ may denote the transconductance of the first transistor, and $g_{m.N1}$ may denote the transconductance of the second transistor.

Figure 4A:
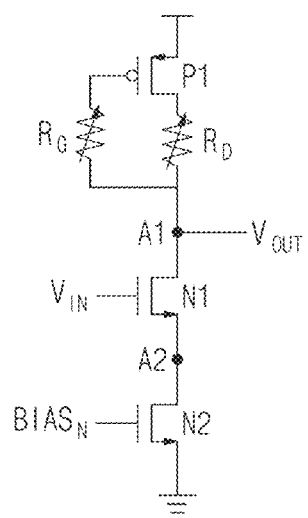
FIG. 4A illustrates a second type active inductor equalizing unit, according to an embodiment of present disclosure.
Figure 4B:
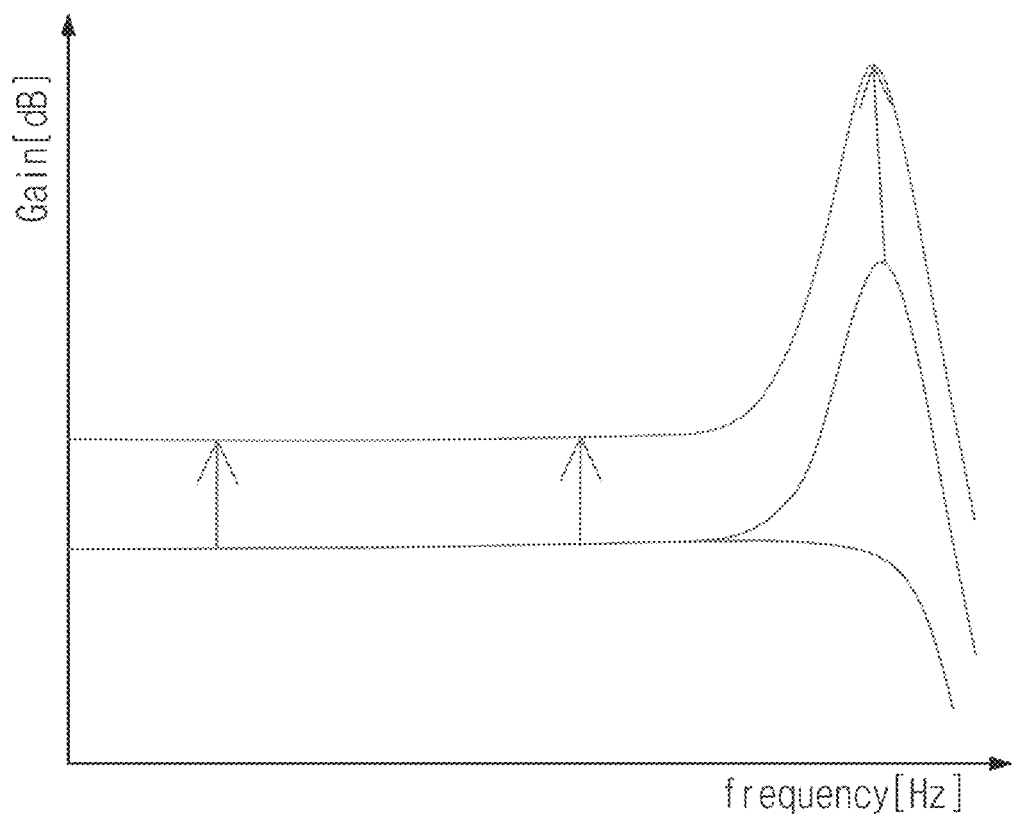
FIG. 4B illustrates an AC response of a second type active inductor equalizing unit.

FIG. 4A illustrates the second type active inductor equalizing unit according to an embodiment of present disclosure, and FIG. 4B illustrates the AC response of the second type active inductor equalizing unit.

Referring to FIG. 4A, the second type active inductor equalizing unit may include a first transistor P1 connected between the power supply voltage and the output node A1, and a second transistor N1 and a third transistor N2 connected in series between the output node A1 and the ground voltage, a first resistor $R_G$ connected between a gate of the first transistor P1 and the output node A1, and a second resistor $R_D$ connected between a drain of the first transistor P1 and the output node A1. According to an embodiment, the first transistor P1 may be a PMOS transistor, the second and third transistors N1 and N2 may be NMOS transistors, and the first and second resistors $R_G$ and $R_D$ may be variable resistors. In this case, the second type active inductor equalizing unit may have two poles and two zeros.

The second transistor N1 may form a current path between the output node A1 and the first node based on the input voltage, and the third transistor N2 may form a current path between the first node and the ground voltage based on the bias voltage.

The third transistor N2 may form a current path based on the bias voltage, such that a current uniformly flows. Accordingly, the transconductance of the second transistor N1 may be maintained.

The third transistor N2 may serve as a current source to receive a signal $BIAS_N$ and to allow a current to uniformly flow, thereby maintaining the transconductance of the second transistor. In this case, the first transistor and the first and second resistors may be interpreted as a diode connected transistor. Accordingly, in the second type active inductor equalizing unit, the first transistor and the resistors may function as a load, and peaking is made at a high frequency, thereby serving as a continuous time linear equalizer circuit.

Referring to FIG. 4B, the AC response of the second type active inductor equalizing unit may be recognized. A blue line is the AC response of a common source amplifier, a red line is the AC response of the first type active inductor equalizing unit, and a green line is the AC response of the second type active inductor equalizing unit.

Since the second type active inductor equalizing unit has two zeros, even the DC gain may be increased, a rising slop may be more sharpened due to the two zeros, and the high-frequency gain may be more increased than that of the first type active inductor equalizing unit. Accordingly, the high-frequency gain may be more increased, and the magnitude of the signal may be more increased, thereby compensating for channel attenuation.

The DC gain may be calculated through Equation 2.

$$DCgain = \frac{g_{m.N1}(R_D + r_{o.P1})}{g_{m.P1} r_{o.P1} + 1} \quad \text{Equation 2}$$

In this case, $r_{o.P1}$ may denote a parasitic resistance of the first transistor, $g_{m.P1}$ may denote the transconductance of the first transistor, $g_{m.N1}$ may denote the transconductance of the second transistor, and $R_D$ may denote a resistance of the second resistor.

Figure 5A:
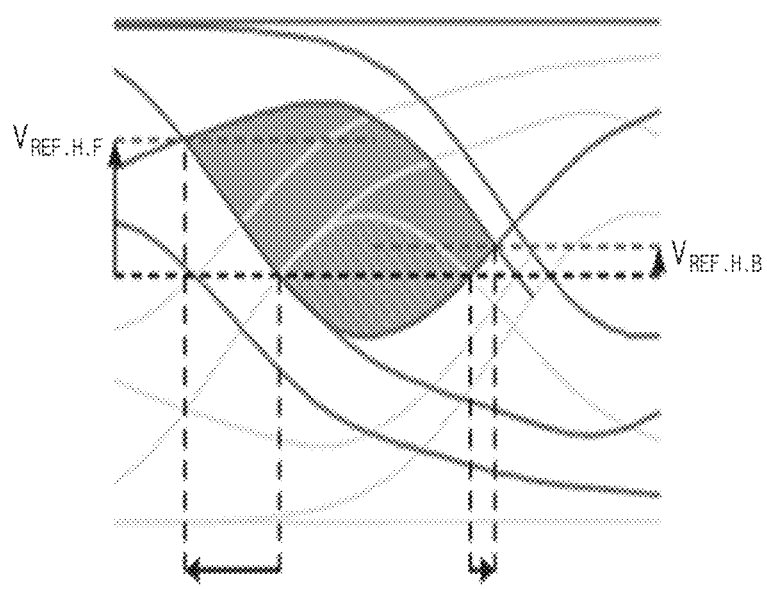
FIGS. 5A to 5C are views illustrating an eye margin depending on the operation of a reference voltage selection equalizing unit, according to an embodiment of the present disclosure.
Figure 5B:
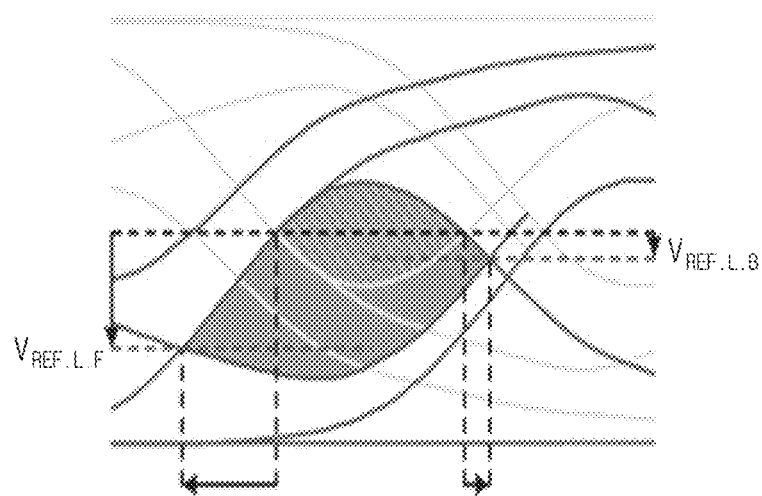
Figure 5C:
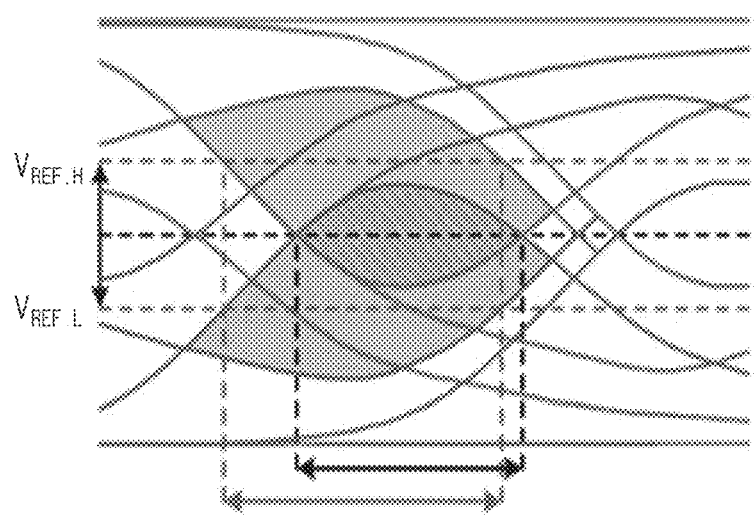

FIGS. 5A to 5C are views illustrating an eye margin depending on an operation of a reference voltage selection equalizing unit according to an embodiment of the present disclosure.

FIG. 5A illustrates an area of an eye margin may be identified when the previous output from the reference voltage selection equalizing unit is high. When the previous output from the reference voltage selection equalizing unit is high, the reference voltage selection equalizing unit receiving the present signal may change the reference voltage value in front of the eye to $V_{REF.H.F}$ and may change the reference voltage value in back of the eye to $V_{REF.H.B}$, thereby expanding the area of the eye margin.

FIG. 5B illustrates an area of an eye margin when the previous output from the reference voltage selection equalizing unit is low. When the previous output from the reference voltage selection equalizing unit is low, the reference voltage selection equalizing unit receiving the present signal may change the reference voltage value in front of the eye to $V_{REF.L.F}$ and may change the reference voltage value in back of the eye to $V_{REF.L.B}$, thereby expanding the area of the eye margin.

FIG. 5C illustrates the area of the eye margin when both the first and second reference voltage values are used not to affect an input signal. When the previous output from the reference voltage selection equalizing unit is low, and when the sampling for the present data is performed, the comparator may use $V_{REF.L}$ as the reference voltage value. When the previous output from the reference voltage selection equalizing unit is high and when the sampling for the present data is performed, the comparator may use $V_{REF.H}$ as the reference voltage value. As described above, when the reference voltage value is selected and used, based on the previous output from the reference voltage selection equalizing unit, the area of the eye margin may be increased without affecting the input signal.

Figure 6A:
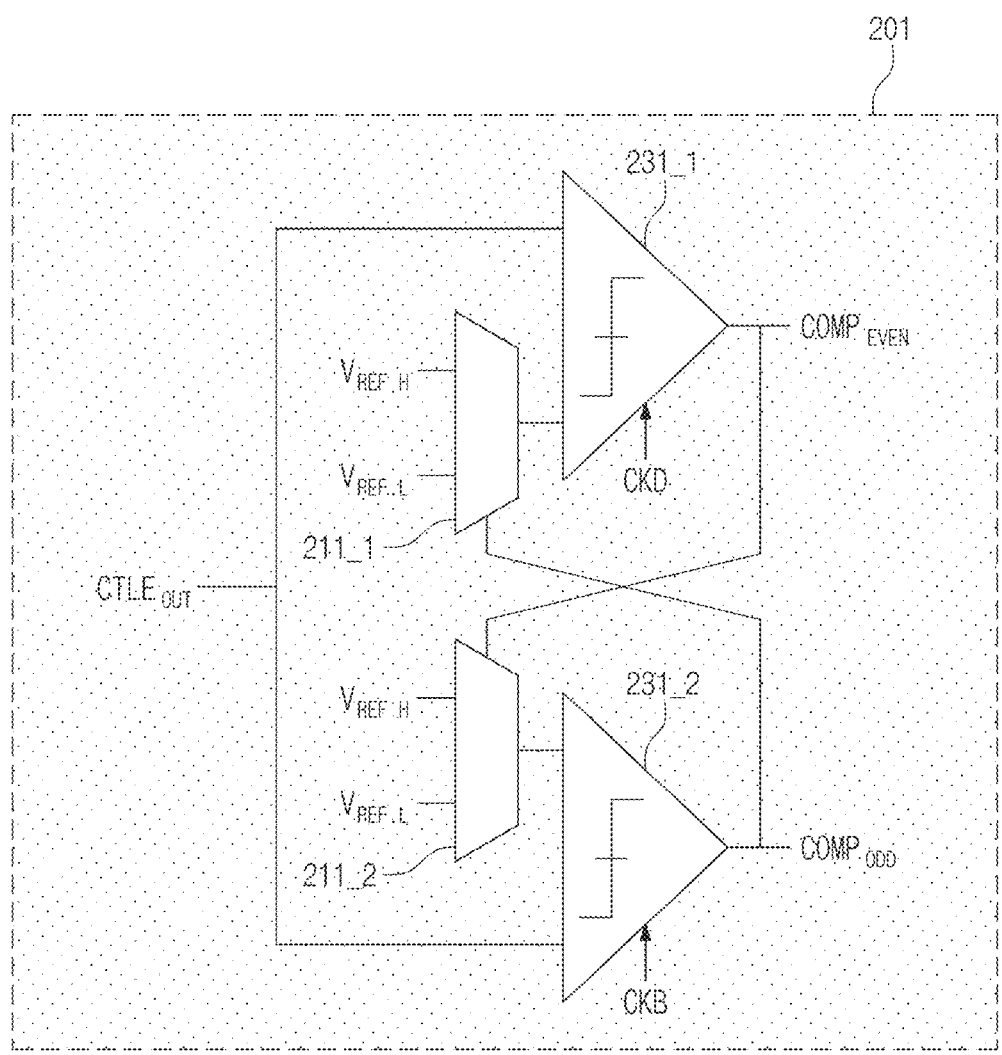
FIGS. 6A and 6B illustrate a reference voltage selection equalizing unit, according to another embodiment of the present disclosure.
Figure 6B:
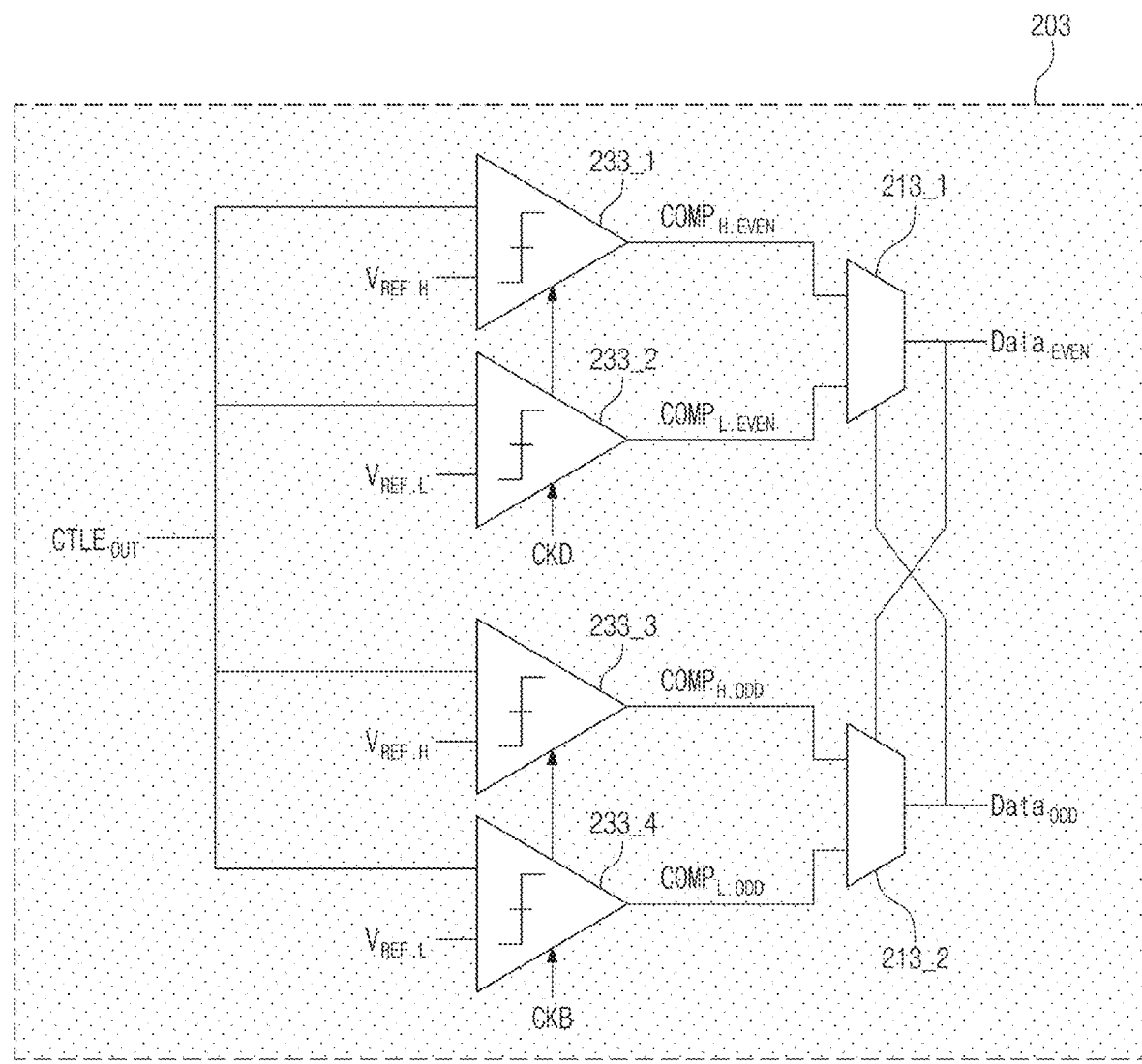

FIGS. 6A and 6B illustrate a reference voltage selection equalizing unit, according to another embodiment of the present disclosure.

FIG. 6A illustrates a reference voltage selection equalizing unit implemented in a half-rate structure according to another embodiment of the present disclosure.

A reference voltage selection equalizing unit 201 implemented in a half-rate structure may have a structure in which a clock rate is used to be half of a data rate. For example, at the data rate of 20 Gb/s, a first clock CKD and a second clock CKB may alternately sample data at a speed of 10 GHz, which is half of the data rate.

A first MUX 211_1 may select one reference voltage value of the first reference voltage value $V_{REF.H}$ and the second reference voltage value $V_{REF.L}$ based on an output $COMP_{ODD}$ from a second comparator 231_2, and may input the selected reference voltage value to a first comparator 231_1. In other words, when viewed in an aspect of an output $COMP_{EVEN}$ from the first comparator 231_1, an output $COMP_{ODD}$ from the second comparator 231_2 may be previous data.

To the contrary, a second MUX 211_2 may select one reference voltage value of the first reference voltage value $V_{REF.H}$ and the second reference voltage value $V_{REF.L}$ based on the output $COMP_{EVEN}$ from the first comparator 231_1, and may input the selected reference voltage value to the second comparator 231_2. In other words, when viewed in an aspect of the output $COMP_{ODD}$ from the second comparator 231_2, the output $CMOP_{EVEN}$ from the first comparator 231_1 may be previous data.

In this case, a feedback loop delay may be T_comp+T_mux. When the feedback loop delay is shorter than 1 UI, previous data information may be transferred to the next data.

FIG. 6B is a view illustrating a reference voltage selection equalizing unit 203 implemented in a half-rate loop unrolling structure according to another embodiment of the present disclosure. FIG. 6B may apply a loop unrolling scheme to reduce the feedback loop delay.

The loop unrolling scheme may be a scheme to first perform sampling with respect to the first reference voltage value $V_{REF.H}$ and the second reference voltage value $V_{REF.L}$ and then to select a reference voltage value later. For example, the output from the continuous linear time equalizing unit may be input to first to fourth comparators 233_1 to 233_4. In this case, the first and third comparators 233_1 and 233_3 may perform sampling with respect to the first reference voltage values $V_{REF.H}$ and an output from the continuous time linear equalizing unit, and the second and fourth comparators 233_2 and 233_4 may perform sampling with respect to the second reference voltage value $V_{REF.L}$ and the output $CLE_{OUT}$ from the continuous time linear equalizing unit.

Since the first clock CKD and the second clock CKB alternately sample data, the second output $DATA_{ODD}$ may be previous data when viewed in an aspect of the first output $DATA_{EVEN}$, and the first output $DATA_{EVEN}$ may be previous data when viewed in an aspect of the second output $DATA_{ODD}$. In other words, the previous data may be data selected from $DATA_{ODD}$ and $DATA_{EVEN}$ which are results of comparison through the first and second mux 213_1 and 213_2. In this case, since the loop delay is only T_mux, the loop delay is more reduced as compared to that in FIG. 6A, thereby increasing the operating speed.

Figure 7:
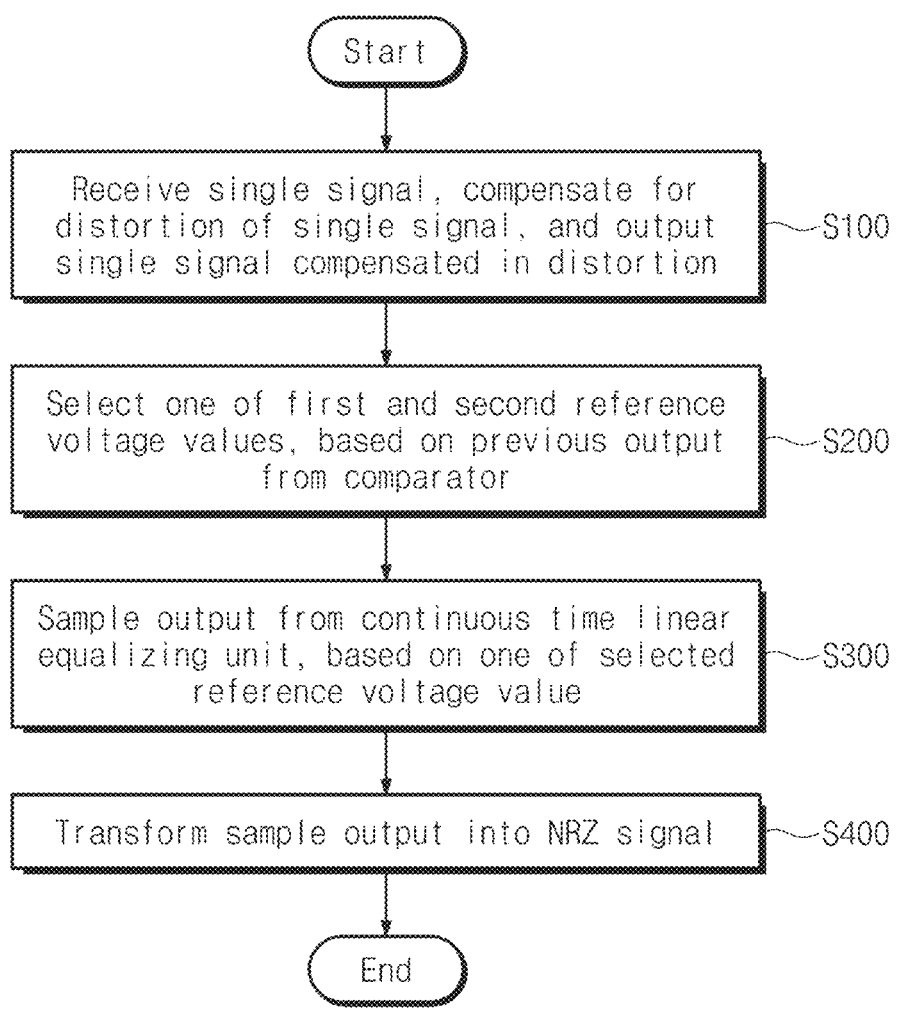
FIG. 7 is a flowchart illustrating a method for operating a single-signal receiver according to an embodiment of the present disclosure.

FIG. 7 is a flowchart illustrating a method for operating a single-signal receiver according to an embodiment of the present disclosure.

Referring to FIG. 7, in S100, a continuous time linear equalizing unit may receive a single signal, may compensate for distortion of the single signal, and may output a single signal in which signal distortion has been compensated. According to an embodiment, the continuous time linear equalizing unit may include a first active inductor equalizing unit and a second active inductor equalizing unit. The first active inductor equalizing unit may be implemented by adding one resistor to a diode-connected transistor. In this case, in the first active inductor equalizing unit, a direct current (DC) gain may be maintained without change, and the high-frequency gain may increase as the resistance value increases.

The second active inductor equalizing unit may be implemented by adding at least one resistor to the first active inductor equalizing unit. In this case, in the second active inductor equalizing unit, a DC gain may increase, and a high-frequency peaking gain may more increase. Accordingly, the continuous time linear equalizing unit may compensate for channel attenuation while maintaining the magnitude of a signal.

In S200, the reference voltage selection equalizing unit may select one of the first and second reference voltage values, based on the previous output from the comparator. For example, the MUX of the reference voltage selection equalizing unit may receive an output from a comparator and may select one of first and second reference voltage values, based on the output from the comparator. The reference voltage value selected from the first reference voltage value and the second reference voltage value may be input into the comparator and may control a next output from the comparator.

In S300, the reference voltage selection equalizing unit may sample an output from the continuous time linear equalizing unit, based on one of the selected reference voltage value. For example, the comparator of the reference voltage selection equalizing unit may perform sampling for a digital signal by comparing the reference voltage value input of the first reference voltage value and the second reference voltage value and the output from the continuous time linear equalizing unit. In this case, the output from the comparator may be fed back to the MUX, thereby expanding the area of the eye margin.

In S400, the latch unit may transform the output from the reference voltage selection equalizing unit into a NRZ signal. The latch unit may transform an RZ signal, which is an output of the comparator, into the NRZ signal by using an SR latch.

According to an embodiment, the single-signal receiver may be used for a single input signal without signal distortion.

An embodiment for the manner suggested in the above description may be included in one of manners for implementing the present disclosure. Accordingly, the embodiment is obviously regarded as a kind of suggested manner. In addition, the above-described manners may be independently implemented, but may be implemented in the combination (merged) form of some suggested manners.

As described above, embodiments of the present disclosure are provided such that those skilled in the art reproduce the present disclosure. Although the above description has been made with reference to embodiments of the present disclosure, those skilled in the art may variously correct and change the embodiments. Accordingly, the present disclosure is not limited to the above embodiments, but provides the widest scope of a right matched with principles and novel features disclosed herein.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A single-signal receiver comprising:
   a continuous time linear equalizing unit configured to receive a single signal, and compensate for distortion of the single signal to generate an output; and
   a reference voltage selection equalizing unit configured to select one of a first reference voltage value and a second reference voltage value based on a previous output from a comparator, and sample the output from the continuous time linear equalizing unit, based on the one of the first reference voltage value and the second reference voltage value.

2. The single-signal receiver of claim 1, wherein the continuous time linear equalizing unit compensates for the single signal by amplifying a high-frequency gain.

3. The single-signal receiver of claim 2, wherein the continuous time linear equalizing unit includes:
   a first type active inductor equalizing unit having two poles and one zero; and
   a second type active inductor equalizing unit having two poles and two zeros.

4. The single-signal receiver of claim 2, wherein the continuous time linear equalizing unit includes:
   a first type active inductor equalizing unit and a second type active inductor equalizing unit, and
   wherein the first type active inductor equalizing unit includes:
   a first transistor connected between a power supply voltage and an output node;
   a second transistor and a third transistor connected to each other in series between the output node and a ground voltage; and
   a resistor connected between a gate of the first transistor and the output node.

5. The single-signal receiver of claim 4, wherein the second transistor forms a current path between the output node and a first node, based on an input voltage, and the third transistor forms a current path between the first node and the ground voltage, based on a bias voltage.

6. The single-signal receiver of claim 5, wherein the first transistor is a PMOS transistor, and the second transistor and the third transistor are NMOS transistors, and
   wherein the first resistor is a variable resistor.

7. The single-signal receiver of claim 5, wherein the first transistor is an NMOS transistor, and the second transistor and the third transistor are PMOS transistors.

8. The single-signal receiver of claim 4, wherein the second type active inductor equalizing unit includes:
   a first transistor connected between the power supply voltage and the output node;
   a second transistor and a third transistor connected in series between the output node and the ground voltage;
   a first resistor connected between a gate of the first transistor and the output node, and
   a second resistor connected between a drain of the first transistor and the output node.

9. The single-signal receiver of claim 8, wherein the first transistor is a PMOS transistor,
   wherein the second transistor and the third transistor are NMOS transistors, and
   wherein the first resistor and the second resistor are variable resistors.

10. The single-signal receiver of claim 8, wherein the first transistor is an NMOS transistor, and
    wherein the second transistor and the third transistor are PMOS transistors.

11. The single-signal receiver of claim 9, wherein the variable resistor is adjusted through a first scheme and a second scheme.

12. The single-signal receiver of claim 11, wherein the first scheme is to connect the resistor to a transistor in parallel, and to adjust a resistance depending on a gate voltage value of the transistor.

13. The single-signal receiver of claim 12, wherein the second scheme is to connect a transistors having a binary size or a thermometer size in parallel, and to adjust the resistance by inputting a signal of '0' or '1' to a gate of the transistors.

14. The single-signal receiver of claim 1, wherein, the reference voltage selection equalizing unit includes:
    a multiplexer to receive the first reference voltage value and the second reference voltage value and receive a previous output from the comparator; and
    a comparator to compare one of the first reference voltage value and the second reference voltage value, which is selected through the multiplexer, with an output from the reference voltage selection equalizing unit.

15. The single-signal receiver of claim 1, wherein the first reference voltage value is a reference voltage value in a high state, and
    wherein the second reference voltage value is a reference voltage value in a low state.

16. The single-signal receiver of claim 15, wherein the multiplexer selects the first reference voltage value and inputs the first reference voltage value to the comparator, when the previous output from the comparator is in a high state, and
    wherein the multiplexer selects the second reference voltage value and inputs the second reference voltage value to the comparator, when the previous output from the comparator is in a low state.

17. A method for operating a single-signal receiver, the method comprising:
    receiving a single signal and compensating for distortion of the single signal to generate an output;
    selecting one of a first reference voltage value and a second reference voltage value based on a previous output from a comparator; and
    sampling an output from a continuous time linear equalizing unit, based on the one of the first reference voltage value and the second reference voltage value.

18. The method of claim 17, wherein the sampling of the output from the continuous time linear equalizing unit includes:
    receiving the first reference voltage value and the second reference voltage value;
    receiving the previous output from the comparator;
    selecting one of the first reference voltage value and the second reference voltage value; and
    comparing the selected reference voltage value with the output from the reference voltage selection equalizing unit.

19. The method of claim 18, further comprising:
  selecting, by a multiplexer, the first reference voltage value to input the first reference voltage value to the comparator, when the previous output from the comparator is in a high state; and
  selecting, by the multiplexer, the second reference voltage value to input the second reference voltage value to the comparator, when the previous output form the comparator is in a low state.

* * * * *